(12) United States Patent
Van Der Ven et al.

(10) Patent No.: US 12,556,193 B2
(45) Date of Patent: Feb. 17, 2026

(54) ANALOG-TO-DIGITAL CONVERTER, ADC, CIRCUIT AND A METHOD FOR CONTROLLING SAID ADC CIRCUIT

(71) Applicant: Stichting IMEC Nederland, Eindhoven (NL)

(72) Inventors: Stan Van Der Ven, Oss (NL); Yao-Hong Liu, Eindhoven (NL); Yuming He, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 127 days.

(21) Appl. No.: 18/528,937

(22) Filed: Dec. 5, 2023

(65) Prior Publication Data

US 2024/0195428 A1 Jun. 13, 2024

(30) Foreign Application Priority Data

Dec. 7, 2022 (EP) .................................... 22211986

(51) Int. Cl.
*H03M 1/12* (2006.01)
*H03M 1/10* (2006.01)

(52) U.S. Cl.
CPC ................................ *H03M 1/1014* (2013.01)

(58) Field of Classification Search
CPC ...... H03M 1/125; H03M 1/127; H03M 1/466; H03M 1/468; H03M 3/458; H03M 1/002; H03M 1/04; H03M 1/0604; H03M 1/1014; H03M 1/123; H03M 1/1235; H03M 1/129; H03M 1/162; H03M 1/38; H03M 1/46; H03M 1/462; H03M 1/48; H03M 1/52; H03M 1/68; H03M 1/804; H03M 13/4107;

(Continued)

(56) References Cited

U.S. PATENT DOCUMENTS 5,296,856 A 3/1994 Mantong
5,933,463 A * 8/1999 Choi .................... H04L 25/067
714/796

(Continued)

FOREIGN PATENT DOCUMENTS

EP 1142123 10/2001
WO WO 00/38325 A1 6/2000

OTHER PUBLICATIONS

Li, Y., Zhao, D., van Dongen, M. N., & Serdijn, W. A. (2011). A 0.5V signal-specific continuous-time level-crossing ADC with charge sharing. 2011 IEEE Biomedical Circuits and Systems Conference, BioCAS 2011, pp. 381-384.

(Continued)

*Primary Examiner* — Linh V Nguyen

(74) *Attorney, Agent, or Firm* — MOSER TABOADA

(57) ABSTRACT

A method for predictive level-crossing, LC, in an analog-to-digital converter, ADC, is provided. The method comprises the steps of comparing a first input signal sampled during a first sampling period with one of an upper threshold level and a lower threshold level to determine if a level crossing has occurred during said first sampling period. Which one of said two threshold levels that is compared with said first input signal is based on if a level crossing occurred during a prior sampling period directly prior to the first sampling period, and which one of the two threshold levels was compared to a prior input signal sampled during said prior sampling period.

15 Claims, 3 Drawing Sheets

(58) Field of Classification Search
CPC .. H03M 13/6597; H03M 3/3287; H03M 3/33; H03M 7/30
USPC ........ 341/155, 158, 159, 164, 165, 167–170
See application file for complete search history.

(56) References Cited

U.S. PATENT DOCUMENTS

| | | | | |
|---|---|---|---|---|
| 6,404,372 | B1* | 6/2002 | Heithoff | H03M 1/48 341/158 |
| 6,492,929 | B1* | 12/2002 | Coffey | H03M 1/127 341/123 |
| 7,064,694 | B1* | 6/2006 | Male | H04N 25/78 341/155 |
| 7,956,790 | B2* | 6/2011 | Chmelar | H03M 1/1215 341/158 |
| 8,121,186 | B2* | 2/2012 | Chmelar | H04L 25/03057 375/233 |
| 8,305,007 | B2* | 11/2012 | Zhao | H05B 45/46 341/160 |
| 8,754,797 | B2* | 6/2014 | Gopinathan | H03M 1/12 341/142 |
| 8,970,419 | B2* | 3/2015 | Farley | H03M 1/12 341/158 |
| 9,654,089 | B2* | 5/2017 | Maher | H03K 5/08 |
| 2011/0315879 | A1* | 12/2011 | Chalk | H03M 1/468 250/340 |

OTHER PUBLICATIONS

Li, Y., Zhao, D., & Serdijn, W. A. (2013). A sub-microwatt asynchronous level-crossing ADC for biomedical applications. IEEE Transactions on Biomedical Circuits and Systems, 7(2), pp. 149-157.

Ravanshad, N., Rezaee-Dehsorkh, H., & Lotfi, R. (2016). A fully-synchronous offset-insensitive level-crossing analog-To-digital converter. Midwest Symposium on Circuits and Systems, Oct. 16-19, 2016, downloaded on Jun. 27, 2022, pp. 1-4.

Yaul, F.M. & Chandrakasan A. P., (2014). A 10 bit SAR ADC with data-dependent energy reduction using LSB-first successive approximation. IEEE Journal of Solid-State Circuits, vol. 49 No. 12, pp. 2825-2834.

Waters, A., Leung, J., & Moon, Un-Ku, LSB-first SAR ADC with bit-repeating for reduced energy consumption. 2014 21st IEEE International Conference on Electronics, Circuits and Systems, ICECS 2014, downloaded on Jun. 27, 2022, pp. 203-206.

Khurana, H. S., Chandrakasan, A. P., & Lee, H. S, Recode then LSB-first SAR ADC for Reducing Energy and Bit-cycles. Proceedings—IEEE International Symposium on Circuits and Systems, May 2018, downloaded on Jun. 27, 2022, pp. 1-5.

Wang, L., Zhang, C., Wang, J., Ma, R., & Zhu, Z., A 10-bit SAR ADC using novel LSB-first successive approximation for reduced bitcycles. Microelectronics Journal 103, pp. 1-8.

Liu, C. C., Chang, S. J., Huang, G. Y., & Lin, Y. Z. (2010). A 10-bit 50-MS/s SAR ADC with a monotonic capacitor switching procedure. IEEE Journal of Solid-State Circuits, vol. 45, No. 4, pp. 731-740.

Zhu, Z., Xiao, Y., & Song, X. (2013). $V_{cm}$-based monotonic capacitor switching scheme for SAR ADC. Electronics Letters, Feb. 28, 2013, vol. 49, No. 5, pp. 1-2.

Ginsburg, B. P., & Chandrakasan, A. P. (2005). An Energy-Efficient Charge Recycling Approach for a SAR Converter With Capacitive DAC. Proceedings—IEEE International Symposium on Circuits and Systems, downloaded on Jun. 27, 2022, pp. 184-187.

Trakimas, M., & Sonkusale, S. R. (2011). An adaptive resolution asynchronous ADC architecture for data compression in energy constrained sensing applications. IEEE Transactions on Circuits and Systems I: Regular Papers, vol. 58, No. 5, May 2011, downloaded on Jun. 27, 2022, pp. 921-934.

Das, A., Rout, S., Urso, A., & Serdijn, W. A. (2019). Activity Dependent Multichannel ADC Architecture using Level Crossing Quantisation for Atrial Electrogram Recording. BioCAS 2019—Biomedical Circuits and Systems Conference, Proceedings, downloaded on Jun. 27, 2022, pp. 1-4.

Ghasemi, M., Ravanshad, N., & Rezaee-Dehsorkh, H. (2020). An Ultra-Low Power Level-Crossing ADC for ECG Monitoring Application. 2020 28th Iranian Conference on Electrical Engineering, ICEE 2020, downloaded on Jun. 27, 2022, pp. 1-6.

Sirimasakul, S., & Thanachayanont, A. (2017). A logarithmic level-crossing ADC. ECTI-CON 2017—2017 14th International Conference on Electrical Engineering/Electronics, Computer, Telecommunications and Information Technology, , downloaded on Aug. 31, 2022 pp. 576-579.

Extended European Search Report in EP 22211986.9 dated May 31, 2023.

* cited by examiner

ANALOG-TO-DIGITAL CONVERTER, ADC, CIRCUIT AND A METHOD FOR CONTROLLING SAID ADC CIRCUIT

CROSS-REFERENCE TO RELATED APPLICATIONS

The present application claims the benefit of and priority to EP Patent Application Serial No. 22211986.9, filed Dec. 7, 2022, the entire contents of which is incorporated herein by reference.

TECHNICAL FIELD

The present disclosure relates to the field of analog-to-digital converters, ADCs, and especially level-crossing, LC, ADCs.

The project leading to this application has received funding from the European Research Council (ERC) under the European Union's Horizon 2020 research and innovation programme (grant agreement No 101001448).

BACKGROUND

ADCs have been, and are currently, in use in almost every field of technology. As the size and power consumption of semiconductors has been steadily decreasing over the years while still providing potential computational power, the size and power consumption of electronic devices have correspondingly decreased. However, it has been observed that power consumption of ADCs has not been reduced to the same degree as the reduction of power consumption in semiconductors. As a consequence, a large portion of the power consumption of modern electronic devices comprising semiconductors and ADCs is attributed to the power consumption of ADCs. Such electronic devices may be configured as, for example, a sensor unit configured to continuously, or intermittently, measure a physical characteristic, i.e. analog data, convert said physical characteristic using an ADC to digital data, and store and/or transmit said digital data.

One type of ADC is the Flash-ADC, which is, as the name infers, a fast type ADC. However, the Flash-ADC is very expensive with regards to power consumption. A more power efficient type of ADC is successive-approximation, SAR, ADCs. For sparse signals, power efficiency can be improved even more by decreasing the number of comparisons by using signal-dependent ADCs, such as a level-crossing ADC.

A major portion of the power consumption of level-crossing ADCs is consumed by one or more comparators of the ADC. In other words, a major portion of the power is consumed when comparing the input signal to a reference signal, in order to determine a value of the input signal.

Therefore, it is of interest to provide a more power efficient ADC and a method for controlling an ADC which provides a more efficient power usage.

SUMMARY

An objective of the present disclosure is to provide an improved ADC having a decreased power consumption, and a method for controlling said ADC.

According to a first aspect of the present disclosure, there is provided a method for performing predictive level-crossing, LC, in an analog-to-digital converter, ADC. The method comprises the steps of comparing a first input signal sampled during a first sampling period with one of an upper threshold level and a lower threshold level to determine if a level crossing has occurred during said first sampling period. Which one of said two threshold levels that is compared with said first input signal is based on if a level crossing occurred during a prior sampling period directly prior to the first sampling period, and which one of the two threshold levels was compared to a prior input signal sampled during said prior sampling period.

According to a second aspect of the present disclosure, there is provided a predictive level-crossing, LC, analog-to-digital converter, ADC, circuit. The LC-ADC circuit comprises at least one threshold level comparator. The at least one threshold level comparator is configured to compare an input signal with an upper threshold level to determine if an up level crossing has occurred, and to compare the input signal with a lower threshold level to determine if a down level crossing has occurred. The ADC circuit is configured to compare a first input signal sampled during a first sampling period with one of said two threshold levels and determine if a level crossing has occurred during said first sampling period. The ADC circuit is further configured to determine which one of said two threshold levels that is compared with said first input signal based on if a level crossing occurred during a prior sampling period directly prior to the first sampling period, and which one of said two threshold levels was compared to a prior input signal sampled during said prior sampling period.

The present disclosure is based on the understanding that a majority of the power consumption of an ADC is due to comparing the input signal to a reference signal. The input signal is conventionally sampled and held, as in input to a sample and hold circuit which outputs the sampled value to the comparator. The reference signal is conventionally produced by a digital-to-analog converter, DAC, circuit which may be comprised by the ADC. For a conventional SAR ADC, the sampled input signal is compared to the reference signal, and if it is determined by the comparator that the sampled input signal has a lower value than the reference signal then the reference signal is increased with a predetermined value, or if it is determined by the comparator that the sampled input signal has a higher value than the reference signal then the reference signal is increased with a predetermined value. Then a subsequent comparison is performed until an approximate value of the sampled input signal is acquired. Hence, the terminology, successive approximation. This type of approximation is done during a cycle, which may be equal to the time of a sampling period. The frequency at which an ADC may be able to compare the sampled input signal to the reference signal may be multiple times higher than the sampling frequency of the ADC, or the sampling frequency of a sample-and-hold circuit configured to provide the ADC with the sampled input signal. Thereby, an ADC may be able to approximate the sampled input signal before a next sampled input signal is received, i.e. before a subsequent sampling period begins.

The predetermined value may be equal to a most significant bit, MSB, or a least significant bit, LSB. Further, the predetermined value may be changed after each comparison. For example, the predetermined value may be doubled, or halved, after each comparison. Starting with the predetermined value being equal to the LSB, and doubling the predetermined value after a comparison, may be understood as using a, so called, LSB-first method. Correspondingly, starting with the predetermined value begin equal to the MSB, and halving the predetermined value after a comparison, may be understood as using a, so called, MSB-first method. However, the predetermined value may be constant over comparisons, which may be understood as using a level-crossing method. It is to be understood that the present disclosure is not limited to how the predetermined value is determined.

The upper threshold level may be defined as a threshold level plus an LSB, and the lower threshold level may be defined as a threshold level minus an LSB. Therefore, by updating the threshold level, both of the upper and lower threshold levels may consequently be updated.

Sparse signals, i.e. signals which are, during a vast majority of the time, behaving predictably, are common in a plethora of fields, such as, for example, sensors used to measure a physical activity of a living body. A signal measured by such as a sensor may, during a majority of the time, follow a frequency of rhythm indicative of a normal condition or remain constant over a period of time. However, sensors are often employed in order to enable the identification of special conditions, in contrast to normal conditions. Therefore, sparse signals may be put through a high-pass filter, thereby eliminating a large portion of components of the signal caused by the normal condition, and leaving components of the signal caused by the special condition. Components of the signal caused by the special condition may be understood as high-frequency spikes in a signal measured by a sensor, which may have been high-pass filtered.

The present disclosure is further based on the understanding that the values of sparse signals, especially sparse signals which have been put through a high-pass filter, is close to a common-mode value (such as 0) for a vast majority of the time. However, current level-crossing ADCs employ a comparison of the input signal with two threshold levels. For example, a sparse signal may have values which lay in between two threshold levels for a long period of time. Within this context, a long period of time may be understood as, at least, a plurality of subsequent sampling periods. A conventional level-crossing ADC would have to compare such a sparse signal with both threshold levels, during each sampling period, in order to sufficiently track the signal and correctly convert it. The present disclosure is, at least in part, based on the realization that in order to track that a signal between two threshold levels, it is enough to compare the signal to one threshold level during a sampling period, and based on whether or not that threshold level was crossed, determining which of the two threshold levels should be used for comparing with the signal during a subsequent sampling period.

If a level crossing did not occur during the prior sampling period in which one of the two threshold levels was compared to the prior input signal, then the other of the two threshold levels may be compared with said first input signal during said first sampling period.

If a level crossing did occur during the prior sampling period in which one of the two threshold levels was compared to the prior input signal, then the same one of the two threshold levels may be compared with said first input signal during said first sampling period.

The present disclosure may be understood as, for a sparse signal, alternating between the upper and lower threshold levels until the input signal crosses the threshold level to which it is being compared. Further, if the first input signal would have crossed the threshold level which it was not compared to, then the ADC will catch it during a sampling period directly subsequent to the first sampling period in which the threshold level would have been crossed. It is to be understood that during a sampling period in which a threshold level has been crossed, then the threshold levels may be adjusted, so as to allow successive approximation of the sampled input signal.

The method may further comprise the step of, and the ADC may be configured to, in response to a level crossing occurring during said first sampling period, adjusting said two threshold levels.

Adjusting the one of said two threshold level may comprise increasing said two threshold levels if the upper threshold level was crossed or decreasing said two threshold levels if the lower threshold level was crossed. The increase and decrease may be equal to a predetermined value, such as for example an LSB or an MSB. If multiple adjustments of the threshold levels made during a single sampling period may be of different size. For example, the size of a first adjustment of the threshold levels may be half the size, or double the size, of a subsequent adjustment of the threshold levels.

A level crossing occurring may comprise an input signal being greater than an upper threshold level or being lesser than a lower threshold level. That a level crossing has occurred may be determined based on an output of a comparator of the ADC. The comparator may receive the sampled input signal and a reference signal generated based on, or representing, one of the threshold levels. The ADC circuit may further comprise a digital-to-analog converter, DAC. The DAC may be configured to generate the upper threshold level and the lower threshold level for the at least one threshold level comparator. Further, the DAC may be configured to generate a reference signal for the comparator of the ADC, based on the upper threshold level or the lower threshold level.

The method may further comprise the step of, and the ADC circuit may be further configured to, in response to determining that a level crossing occurred during said first sampling period, outputting one or more signals indicating said level crossing and which one of said two threshold levels that was compared with said first input signal. The one or more signals may be sufficient for creating a digital version of the sampled input signal. For example, the one or more signals may comprise an event signal indicating said level crossing, and a direction signal indicating which one of said two threshold levels that was compared with said first input signal. However, the important states to track are whether an upper threshold level has been crossed, a lower threshold level has been crossed, or if non threshold level has been crossed. Therefore, in theory, only three states may be required to creating a digital version of the sampled input signal, and it may be referred to ternary, or tri-state, transmission.

The at least one threshold level comparator may comprise an upper threshold level comparator configured to compare the input signal with the upper threshold level to determine if an up level crossing has occurred, and a lower threshold level comparator configured to compare the input signal with the lower threshold level to determine if a down level crossing has occurred. Alternatively, the ADC may comprise a single comparator.

The present disclosure relates to all possible combinations of features recited in the claims. Objects and features described according to the first aspect may be combinable with, or replaced by, objects and features described according to the second aspect, the third aspect, and/or the fourth aspect, and vice versa.

Further objects and advantages of the various embodiments of the present disclosure will be described below by means of exemplifying embodiments.

BRIEF DESCRIPTION OF THE DRAWINGS

The above, as well as additional objects, features and advantages of the present disclosure, will be better understood through the following illustrative and non-limiting detailed description, with reference to the appended drawings. In the drawings like reference numerals will be used for like elements unless stated otherwise.

Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Figure 1:
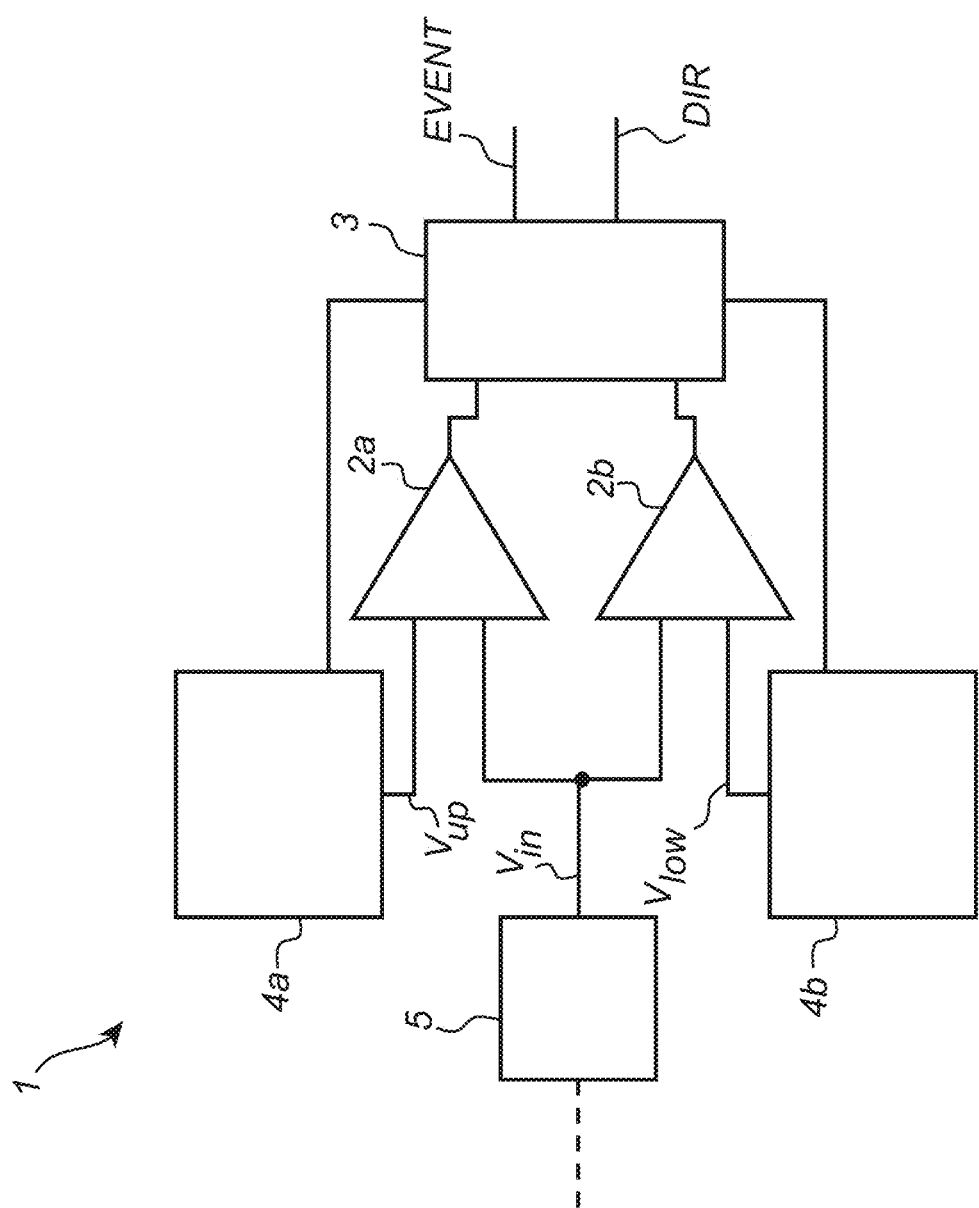
FIG. 1 is a schematic view of an ADC circuitry according to an exemplary embodiment of the present disclosure.

FIG. 1 illustrates an ADC circuitry 1 according to an exemplary embodiment of the present disclosure.

The ADC circuitry 1 shown in FIG. 1 comprises two threshold level comparators 2a, 2b. Each comparator 2a, 2b is configured to receive two analog signals and determine which of the two received analog signals is greater. Based on the determination, the comparators 2a, 2b are configured to output a signal indicating said determination. The ADC circuitry 1 further comprises logic circuitry 3 configured to receive the signal(s) from the comparators 2a, 2b.

The ADC circuitry 1 may further comprise sample-and-hold circuitry 5 configured to sample and hold a signal. The sample-and-hold circuitry 5 may be configured to input the sampled and held signal, i.e. an input signal $V_{in}$ to the comparator(s) 2a, 2b of the ADC circuitry 1. The sample-and-hold circuitry 5 may be configured to operate at sampling frequency, and may thereby input an input signal $V_{in}$ to the comparator(s) 2a, 2b until a new input signal $V_{in}$ is sampled and input to the comparator(s) 2a, 2b, wherein the time between samplings may be a sampling period.

The ADC circuitry 1 may further comprise at least one DAC 4a, 4b configured to generate analog signals based on a received digital signal. The ADC circuitry 1 is shown in FIG. 1 to comprise 2 DACs 4a, 4b. One of the DACs 4a may be configured to generate an upper threshold level $V_{up}$ which may be input to a comparator 2a, and the other DAC 4b may be configured to generate a lower threshold level $V_{low}$ which may be input to a comparator 2b. The threshold levels $V_{up}$, $V_{low}$ may be understood as analog signals. The DAC(s) 4a, 4b may be configured to generate the threshold levels $V_{up}$, $V_{low}$ based on a received digital signal received from the logic circuitry 3.

It is to be understood that the present disclosure is not limited to comprising two comparators 2a, 2b, and may alternatively, comprise, for example one comparator. Further, the present disclosure is not limited to comprising two DACs 4a, 4b, and may alternatively, comprise, for example, one DAC. For example, the ADC circuitry 1 may comprise one comparator and switches configured to allow the input signal $V_{in}$ to be connected to either input of the single comparator. Further, the ADC circuitry 1 may comprise one single DAC which may be configured to generate both threshold levels $V_{up}$, $V_{low}$, and the ADC circuitry 1 may comprise switches configured to allow either threshold level $V_{up}$, $V_{low}$ to be input to either input of the comparator(s).

The ADC circuitry 1 is configured to determine which one of said two threshold levels $V_{up}$, $V_{low}$ that is compared with the input signal $V_{in}$ during a current sampling period based on if a level crossing occurred during a prior sampling period directly prior to the current sampling period, and which one of said two threshold levels $V_{up}$, $V_{low}$ was compared to a prior input signal sampled during said prior sampling period. The determination may be done by the logic circuitry 3. The ADC circuitry 1 may be configured to keep track of which threshold levels $V_{up}$, $V_{low}$ that has been used in prior comparisons, and the ADC circuitry 1 may be configured to keep track of if a level crossing occurred.

The logic circuitry 3 is shown as outputting two signals EVENT, DIR. A first of the signals may be understood as an event signal EVENT, and a second signal of the signal may be understood as a direction signal DIR. For example, the logic circuitry 3 may be configured to output a logic one via the event signal EVENT when a level crossing has occurred. Further, the logic circuitry 3 may, for example, output a logic one when the upper threshold level $V_{up}$ was the most previously crossed threshold level, and may, for example output a logical zero when the lower threshold level $V_{low}$ was the most previously crossed threshold level. Such an example of the event signal EVENT and the direction signal DIR could be used to digitally recreate (an approximation of) the sampled input signal. However, it is to be understood that the present disclosure is not limited to outputting binary signals in this manner, and may use other methods of digitally representing the (approximation of) the sampled input signal.

Figure 2:
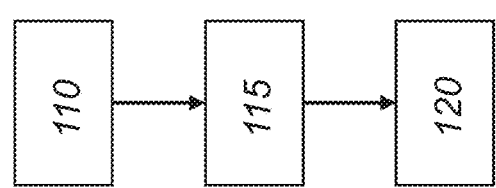
FIG. 2 is a flow-chart of a method according to an exemplary embodiment of the present disclosure.

FIG. 2 is flow-chart of a method 100 according to an exemplary embodiment according to an aspect of the present disclosure.

The method 100 shown in FIG. 2 comprises the steps of comparing 110 a first input signal (not shown; see e.g. FIG. 1 or 3) sampled during a first sampling period (not shown; see e.g. FIG. 1 or 3) with one of an upper threshold level (not shown; see e.g. FIG. 1 or 3) and a lower threshold level (not shown; see e.g. FIG. 1 or 3) to determine if a level crossing has occurred during said first sampling period. Which one of said two threshold levels that is compared with said first input signal is based on if a level crossing occurred during a prior sampling period directly prior to the first sampling period, and which one of the two threshold levels was compared to a prior input signal sampled during said prior sampling period.

The method 100 may comprise, in response to a determination 110 that a level crossing has occurred during said first sampling period, adjusting 115 said two threshold levels.

The method 100 may further comprise, in response to determining that a level crossing occurred during said first sampling period, outputting 120 one or more signals (not shown; see e.g. FIG. 1) indicating said level crossing and which one of said two threshold levels that was compared with said first input signal.

Figure 3:
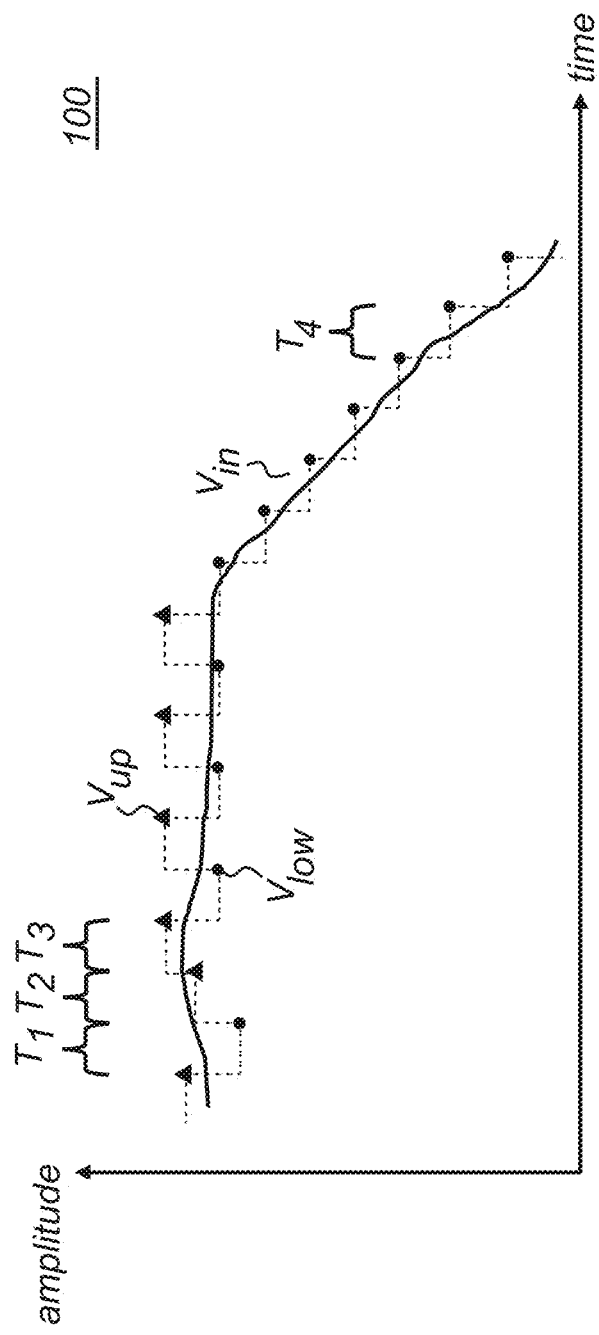
FIG. 3 is a graph showing steps of a method according to an exemplary embodiment according to an aspect of the present disclosure.

FIG. 3 is a graph showing steps of a method 100 according to an exemplary embodiment according to an aspect of the present disclosure.

The graph shown in FIG. 3 is plotted with along the horizontal axis, and amplitude along the vertical axis.

An input signal $V_{in}$ is shown in the chart as a thick solid line. The input signal $V_{in}$ may be understood as being measured by a sensor, or other type of measuring device, and is subsequently input to an ADC circuitry (not shown; see e.g. FIG. 1) according to a first aspect of the present disclosure. However, it is to be understood that the actual input signal $V_{in}$ which is input to the may be sampled at an amplitude and then held at said amplitude until a subsequent sample is made. However, in order to provide an increased clarity and understanding, such a sampled-and-held signal is not displayed. Instead, sampling periods $T_{1-4}$ are indicated in FIG. 3 by vertical dashed lines (which are also thinner than the thick solid line indicated the input signal $V_{in}$). The sampled value, or amplitude, of the input signal $V_{in}$ during a given sampling period may be understood as being equal to the amplitude where the input signal $V_{in}$ and a corresponding vertical line cross each other.

FIG. 3 further comprises a plurality of horizontal dashed lines. Some of the horizontal dashed lines has one end which comprises a filled circular shape, and they represent a lower threshold level $V_{low}$. The remaining horizontal dashed lines has one end which comprises a filled triangular shape, and they represent an upper threshold level $V_{up}$.

For first sampling period $T_1$ the lower threshold level $V_{low}$ is being compared with the input signal $V_{in}$. Further, during the sampling period prior to the first sampling period $T_1$ the upper threshold level $V_{up}$ was being compared to the input signal $V_{in}$. Therefore, in accordance the method 100 according to the present disclosure, during the second sampling period $T_2$, which is directly subsequent, or following, the first sampling period $T_1$, the other threshold level, i.e. the upper threshold level $V_{up}$, is being used compare with the input signal $V_{in}$.

During the second sampling period $T_2$ the input signal crosse the upper threshold level $V_{up}$, and therefore, the upper threshold level $V_{up}$, is increased once such that the upper threshold level $V_{up}$, is greater than the input signal $V_{in}$.

Consequently, during a third sampling period $T_3$, the input signal $V_{in}$ is being compared with the upper threshold level $V_{up}$, i.e. the same threshold level, as it occur a level-crossing during the prior sampling period, i.e. the second sampling period $T_2$.

FIG. 3 further shows that during a fourth sampling period $T_4$, which is after but not directly following the third sampling period $T_3$, multiple level-crossings occur. Phrased differently, the lower threshold level $V_{low}$, needed to be adjusted multiple times before the lower threshold level $V_{low}$ was lower than the input signal $V_{in}$. In can further be seen that each adjustment of the lower threshold level $V_{low}$ made during the fourth sampling period $T_4$ is greater than the one directly preceding it. This may be understood as a first adjustment of the lower threshold level $V_{low}$ being equal to a LSB, a second adjustment lower threshold level $V_{low}$ being equal to a second-LSB, and so on. However, the present disclosure is not limited to such an adjustment, and may involve steady-level adjustments or decreasing adjustment steps.

FIG. 3 clearly shows how the present disclosure allows for tracking of an input signal $V_{in}$, by comparing every other threshold level when no level crossings are determined, and by following the input signal $V_{in}$ when a level crossing does occur, by continuing to compare the threshold level which was crossed during the prior sampling period. Thus, the present disclosure allows for reducing the amount of comparisons by up to 50%, which may greatly reduce the energy consumption of an ADC.

In the above the inventive concept has mainly been described with reference to a limited number of examples. However, as is readily appreciated by a person skilled in the art, other examples than the ones disclosed above are equally possible within the scope of the present disclosure.

The invention claimed is:

1. A method for predictive level-crossing, LC, in an analog-to-digital converter, ADC, comprising the steps of:
    comparing a first input signal, $V_{in}$, sampled during a first sampling period, $T_{1,2,3,4}$, with one of an upper threshold level, $V_{up}$, and a lower threshold level, $V_{low}$, to determine if a level crossing has occurred during said first sampling period, and
    wherein which one of said two threshold levels that is compared with said first input signal is based on:
    if a level crossing occurred during a prior sampling period directly prior to the first sampling period, and
    which one of the two threshold levels was compared to a prior input signal sampled during said prior sampling period.

2. The method according to claim 1, wherein if a level crossing did not occur during the prior sampling period in which one of the two threshold levels was compared to the prior input signal, then the other of the two threshold levels is compared with said first input signal during said first sampling period.

3. The method according to claim 1, wherein if a level crossing did occur during the prior sampling period in which one of the two threshold levels was compared to the prior input signal, then the same one of the two threshold levels is compared with said first input signal during said first sampling period.

4. The method according to claim 1, further comprising the steps of:
    in response to a level crossing occurring during said first sampling period, adjusting said two threshold levels.

5. The method according to claim 4, wherein adjusting the one of said two threshold levels comprises increasing said two threshold levels if the upper threshold level was crossed or decreasing said two threshold levels if the lower threshold level was crossed.

6. The method according to claim 1, wherein a level crossing occurring comprises an input signal being greater than an upper threshold level or being lesser than a lower threshold level.

7. The method according to claim 1, further comprising the steps of:
    in response to determining that a level crossing occurred during said first sampling period:
        outputting (120) one or more signals indicating said level crossing and which one of said two threshold levels that was compared with said first input signal.

8. An analog-to-digital converter, ADC, circuit comprising:
    at least one threshold level comparator configured to:
        compare an input signal, $V_{in}$, with an upper threshold level, $V_{up}$, to determine if an up level crossing has occurred, and compare an input signal, $V_{in}$, with a lower threshold level, $V_{low}$, to determine if a down level crossing has occurred; and
    wherein the ADC circuit is configured to:
    compare a first input signal sampled during a first sampling period with one of said two threshold levels and determine if a level crossing has occurred during said first sampling period;
    wherein the ADC circuit is further configured to determine which one of said two threshold levels that is compared with said first input signal based on: if a level crossing occurred during a prior sampling period directly prior to the first sampling period, and which one of said two threshold levels was compared to a prior input signal sampled during said prior sampling period.

9. The ADC circuit according to claim 8, wherein if a level crossing did not occur during the prior sampling period in which one of the two threshold levels was compared to the prior input signal, then the other of the two threshold levels is compared during said first sampling period.

10. The ADC circuit according to claim 8, wherein if a level crossing did occur during the prior sampling period in which one of the two threshold levels was compared to the prior input signal, then the same one of the two threshold levels is compared during said first sampling period.

11. The ADC circuit according to claim 8, wherein the ADC circuit is further configured to:
   in response to a level crossing occurring during said first sampling period, adjusting said two threshold levels.

12. The ADC circuit according to claim 11, wherein adjusting said two threshold level comprises increasing said two threshold levels if the upper threshold level was crossed or decreasing said two threshold levels if the lower threshold level was crossed.

13. The ADC circuit according to claim 8, wherein the ADC circuit is further configured to:
   in response to determining that a level crossing occurred during said first sampling period:
      output one or more signals indicating said level crossing and which one of said two threshold level comparators was that used during said first sampling period.

14. The ADC circuit according to claim 8, further comprising a digital-to-analog converter, DAC, configured to generate the upper threshold level and the lower threshold level for the at least one threshold level comparator.

15. The ADC circuit according to claim 8, wherein the at least one threshold level comparator comprises:
   an upper threshold level comparator configured to: compare the input signal with the upper threshold level to determine if an up level crossing has occurred; and
   a lower threshold level comparator configured to: compare the input signal with the lower threshold level to determine if a down level crossing has occurred.

* * * * *